(12) United States Patent
Moden et al.

(10) Patent No.: US 6,894,521 B2
(45) Date of Patent: *May 17, 2005

(54) BURN-IN CARRIER FOR A SEMICONDUCTOR DIE

(75) Inventors: Walter L. Moden, Meridian, ID (US); John O. Jacobson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/395,923

(22) Filed: Mar. 24, 2003

(65) Prior Publication Data

US 2003/0206034 A1 Nov. 6, 2003

Related U.S. Application Data

(60) Continuation of application No. 10/078,982, filed on Feb. 20, 2002, now Pat. No. 6,538,463, which is a continuation of application No. 09/488,210, filed on Jan. 19, 2000, now Pat. No. 6,380,756, which is a continuation of application No. 08/994,005, filed on Dec. 18, 1997, now Pat. No. 6,064,221, which is a division of application No. 08/581,905, filed on Jan. 2, 1996, now Pat. No. 6,551,845.

(51) Int. Cl.[7] ............................................. G01R 31/28
(52) U.S. Cl. ...................................... 324/765; 324/755
(58) Field of Search ................................ 324/765, 755, 324/754, 158.1; 439/66–70, 86–91; 438/14–18

(56) References Cited

U.S. PATENT DOCUMENTS 4,447,720 A    5/1984  Ogawa et al.
4,796,078 A    1/1989  Phelps, Jr. et al.
4,826,705 A    5/1989  Drain et al.
4,897,360 A    1/1990  Guckel et al.
4,899,107 A    2/1990  Corbett et al.

(Continued)

FOREIGN PATENT DOCUMENTS

JP      407235555 A     9/1995
JP      409017810 A     1/1997
WO      WO 9629730 A1   9/1996

OTHER PUBLICATIONS

Management of Electronics Assembly; 1992; pps. 44–113, (month unavailable).

Lau; Handbook of Fine Pitch Surface Mount Technology; 1994; pps. 178–179, (month unavailable).

Lau; Chip on Board Technologies for Multichip Modules; 1994; pps. 18–21; 102–107; 186–189 and 196–199, (month unavailable).

Article featuring Trademarks of Du Pont for temp–r–tape kapton, K 100, 102, K 103, K 104, K 250, K250X, and K 350, a publication of CHR Industries, pp. 255 and 256.

*Primary Examiner*—Vinh P. Nguyen
(74) *Attorney, Agent, or Firm*—TraskBritt, PC

(57) ABSTRACT

A method of using adhesive tape to temporarily retain a die being temporarily held in a fixture during testing and burn-in. The method of the present invention uses a die cut piece of adhesively coated tape to hold a die in a test and burn-in fixture. Upon subsequent heating of the tape beyond the normal operating range of the adhesive coating on the tape, the die is removed from the tape, the tape is removed from the test and burn-in fixture, and the remaining adhesive, if any, is removed from the test and burn-in fixture.

6 Claims, 4 Drawing Sheets

U.S. PATENT DOCUMENTS

| | | |
|---|---|---|
| 4,992,850 A | 2/1991 | Corbett et al. |
| 5,048,179 A | 9/1991 | Shindo et al. |
| 5,118,567 A | 6/1992 | Komiyama et al. |
| 5,145,009 A | 9/1992 | Mheidle et al. |
| 5,173,451 A * | 12/1992 | Kinsman et al. ............... 438/15 |
| 5,177,032 A | 1/1993 | Fogal et al. |
| 5,180,974 A | 1/1993 | Mitchell et al. |
| 5,208,188 A | 5/1993 | Newman |
| 5,218,168 A | 6/1993 | Mitchell et al. |
| 5,256,598 A | 10/1993 | Farnworth et al. |
| 5,304,842 A | 4/1994 | Farnworth et al. |
| 5,336,649 A | 8/1994 | Kinsman et al. |
| 5,349,234 A | 9/1994 | DesJardin et al. |
| 5,367,253 A | 11/1994 | Wood et al. |
| 5,381,234 A | 1/1995 | Barbee et al. |
| 5,406,459 A | 4/1995 | Tsukamoto et al. |
| 5,408,190 A | 4/1995 | Wood et al. |
| 5,411,921 A | 5/1995 | Negoro |
| 5,424,652 A | 6/1995 | Hembree et al. |
| 5,440,240 A | 8/1995 | Wood et al. |
| 5,442,386 A | 8/1995 | Childers et al. |
| 5,495,179 A | 2/1996 | Wood et al. |
| 5,495,699 A | 3/1996 | Buckley, Jr. |
| 5,620,928 A | 4/1997 | Lee et al. |
| 5,661,336 A | 8/1997 | Phelps et al. |
| 5,696,033 A | 12/1997 | Kinsman |
| 5,874,319 A | 2/1999 | Dunaway et al. |
| 6,064,221 A | 5/2000 | Moden et al. |
| 6,261,927 B1 | 7/2001 | Natarajan et al. |
| 6,380,756 B1 | 4/2002 | Moden et al. |
| 6,538,463 B2 | 3/2003 | Moden et al. |
| 6,551,845 B1 | 4/2003 | Moden et al. |

* cited by examiner

BURN-IN CARRIER FOR A SEMICONDUCTOR DIE

CROSS-REFERENCE TO RELATED APPLICATIONS

This application is a continuation of application Ser. No. 10/078,982, filed Feb. 20, 2002, now U.S. Pat. No. 6,538,463, issued Mar. 25, 2003, which is a continuation of application Ser. No. 09/488,210, filed Jan. 19, 2000, now U.S. Pat. No. 6,380,756 B1, issued Apr. 30, 2002, which is a continuation of application Ser. No. 08/994,005, filed Dec. 18, 1997, now U.S. Pat. No. 6,064,221, issued May 16, 2000, which is a divisional of application Ser. No. 08/581,905, tiled Jan. 2, 1996, now U.S. Pat. No. 6,551,845, issued Apr. 22, 2003.

BACKGROUND OF THE INVENTION

1. Field of the Invention

This invention relates to a method of temporarily securing a die to a burn-in carrier for the purpose of burn-in and testing of the die. More specifically, this invention relates to a method of temporarily securing a die to a burn-in carrier through the use of adhesive tape for the purpose of burn-in and testing of the die.

2. State of the Art

Integrated circuit memory devices, such as dynamic random access memories (DRAMS) and static random access memories (SRAMS) are tested during manufacture and often prior to use. Such testing is for the purpose of insuring that only known good dies are subsequently used.

One of the test procedures which is used to determine the viability of integrated semiconductor circuits is a burn-in procedure. The burn-in test is intended to stress the electrical interconnection of the die and drive any contaminants in the body of the die into the active circuitry, thus causing failure. This test is based on data indicating that dice that are prone to these types of failures will actually malfunction in the early part of their lifetime. By conducting burn-in tests, the early failures of the dice are detected and only known good dice are subsequently used in applications.

In the testing of a die prior to encapsulation, temporary electrical connection must be effected between the die and a test fixture. This is typically done by connecting the test fixture to the die using the bond pads of the die through the use of wire bonds or tape automated bonding. As is evident, the testing of an unpackaged or bare die requires a significant amount of handling. Since the test package must be separated from the die, the temporary packaging may be more complicated than either standard discrete packaging or multichip module packaging. The package must be compatible with any desired test and burn-in procedures without damaging the die at the bond pads or elsewhere during any such test or burn-in procedure.

In U.S. Pat. No. 4,899,107, a reusable burn-in test fixture for discrete tape automated bonding (TAB) a die is disclosed. The fixture consists of two halves, one of which is a die cavity plate for receiving semiconductor dies as the units under test and the other half establishes electrical contact with the dice and with the burn-in oven. The dice are held in position within the carrier by being resiliently mounted therein.

In U.S. Pat. No. 5,408,190, a reusable burn-in test fixture for discrete dice is disclosed. The reusable burn-in test fixture comprises two halves, the first half containing a cavity in which a die is inserted. As disclosed, a precured RTV silicone backing strip is used to retain a die in a face-up position in the carrier. The precured RTV strip, commonly known as a "gel pack," exhibits a static charge and coefficient of friction sufficient to hold an intermediate substrate in place without the use of adhesive and elastomerically biases the die against the cover plate of the test fixture.

In U.S. Pat. No. 5,336,649, a precured RTV silicone strip, "gel pack," is used for temporarily securing the die in place within a package body. The RTV silicone strip exhibits a static charge and coefficient of friction sufficient to hold the die in place within a burn-in carrier. Another embodiment discloses the use of a tape type die attach adhesive, known under the trademark of E.I. Du Pont de Nemours of Wilmington, Del. as Kapton QL Die Attach Adhesive, to hold the die in place during burn-in. The adhesive is heated, but for a shorter time than for a permanently packaged die. This allows a standard process setup to be used for temporary die attachment while permitting the adhesive attachment of the die to be readily overcome subsequent to testing and burn-in. Also disclosed is the use of water soluble hot melt glass, a thermoplastic material, to temporarily hold the die during testing and burn-in. After testing, the hot melt glass is removed by dissolving it using deionized water, thereby freeing the die from the package. In yet another instance, the die may be adhesively bonded to the carrier through the use of a sugar and water solution. After testing, the package including the die is placed in deionized water, which causes the sugar to dissolve, thereby freeing the die from the package.

However, these prior types of die attachment techniques have inherent problems. They either require specific types of mechanical mounting arrangements to be designed into the burn-in carrier, or require that the silicone "gel pack" exhibit sufficient electrostatic charge to retain the die in the burn-in carrier, or require the careful spraying of the adhesive in the burn-in carrier to minimize overspray of the adhesive, or require the use of a water cleaning solution after testing and burn-in to remove the adhesive remnants.

BRIEF SUMMARY OF THE INVENTION

The present invention is directed to a method of using adhesive tape to temporarily retain a die being temporarily held in a fixture during testing and burn-in. The method of the present invention uses a die cut piece of adhesively coated tape to hold a die in a test and burn-in fixture. Upon subsequent heating of the tape beyond the normal operating range of the adhesive coating on the tape, the die is removed from the tape, the tape is removed from burn-in fixture, and the remaining adhesive, if any, is removed from the test and

BRIEF DESCRIPTION OF THE SEVERAL VIEWS OF THE DRAWINGS

The present invention will be better understood when the drawings are taken in conjunction with the description of the invention wherein.

DETAILED DESCRIPTION OF THE INVENTION

Figure 1:
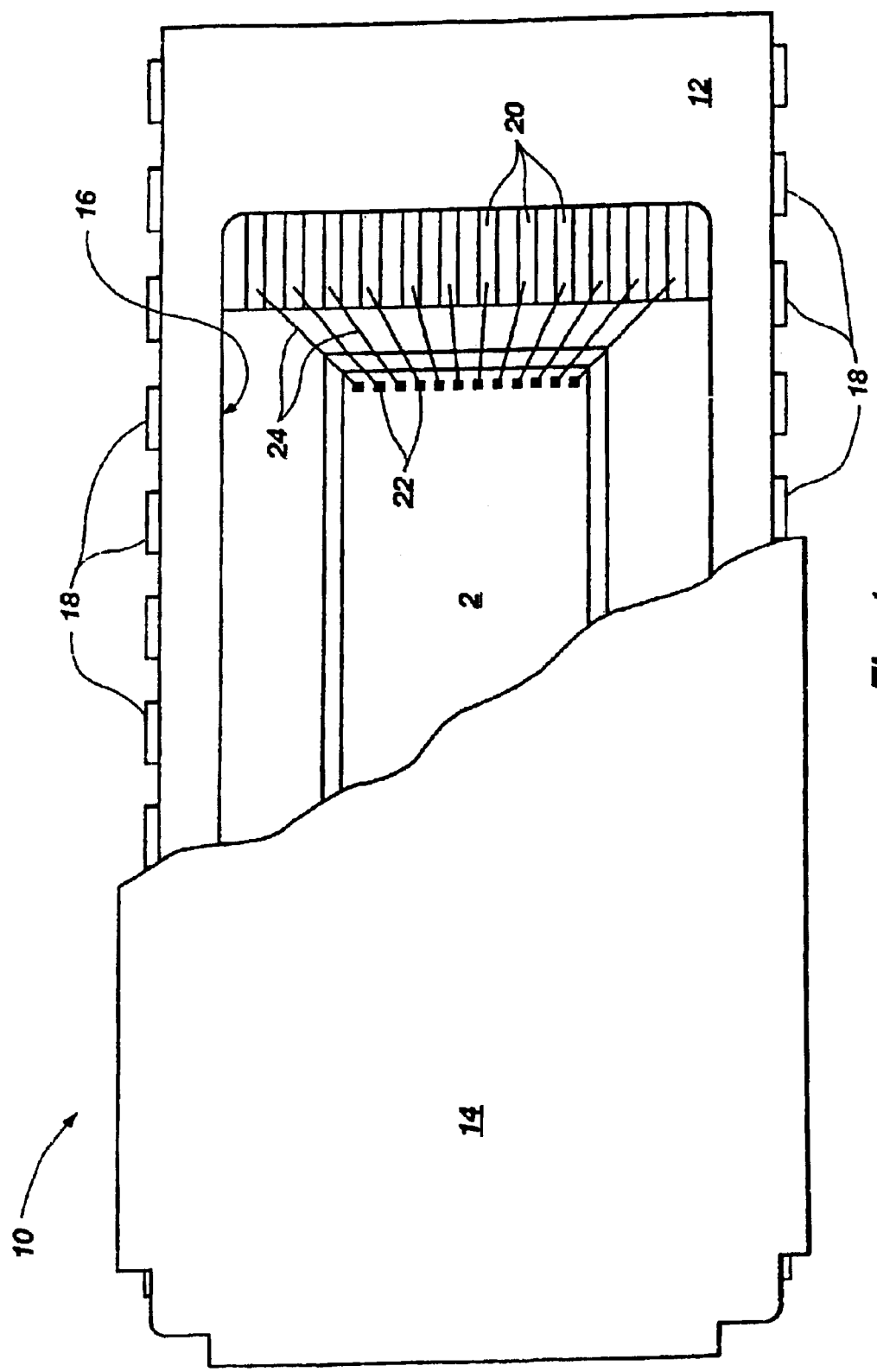
FIG. 1 is a top view of a substrate on which a softbond wirebond connection has been made during the method of the present invention.
Figure 2:
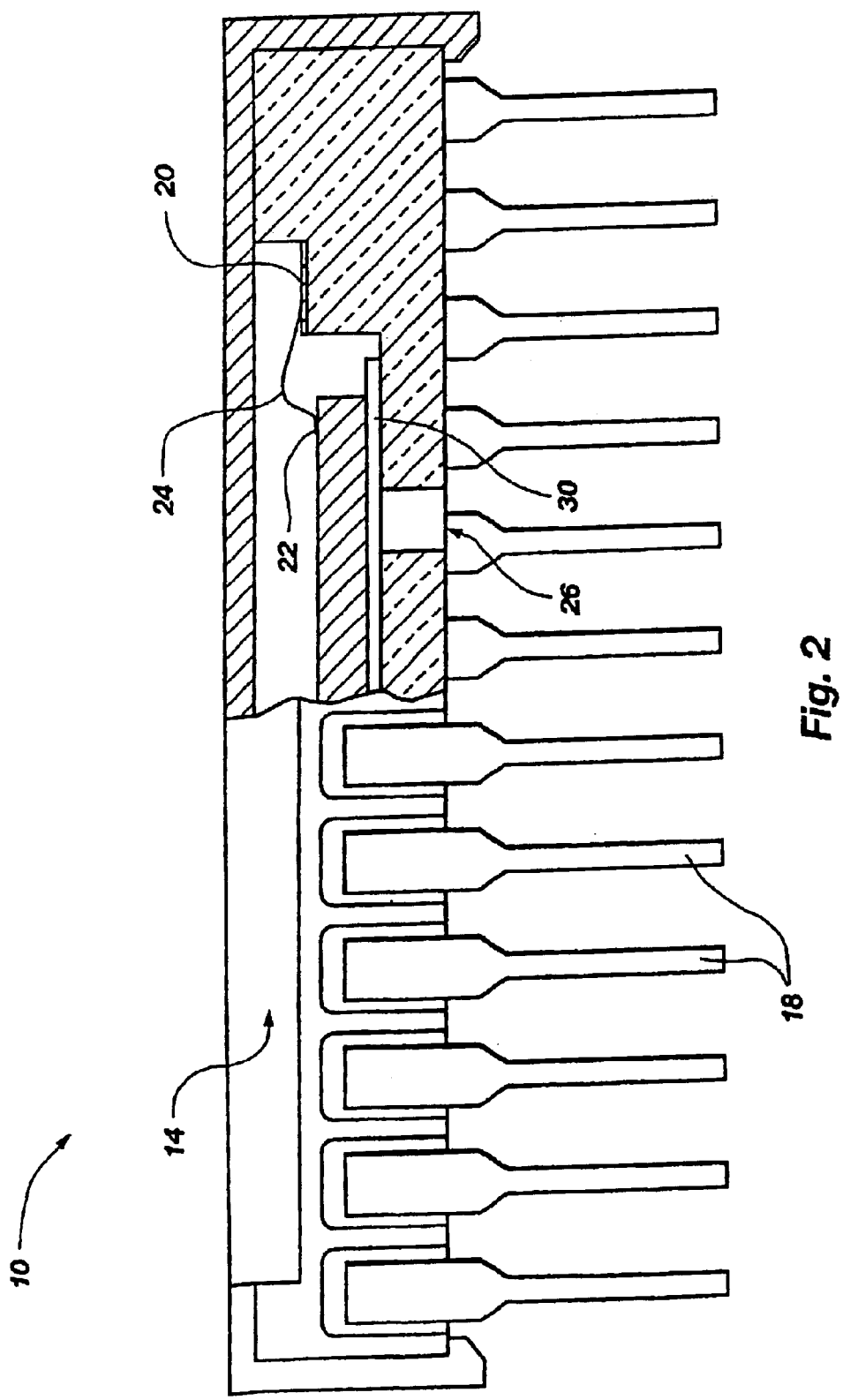
FIG. 2 is a partial cross-sectional view of the substrate shown in drawing FIG. 1.

Referring to drawing FIGS. 1 and 2, a testing and burn-in fixture 10 includes a package body 12 and a cover plate 14.

The package body 12 includes a die receiving cavity 16 in which a die 2 is retained. The die receiving cavity 16 has any desired size and shape which is necessary to accommodate the die 2 to act as a carrier for the testing and burn-in of the die 2. A plurality of external connector leads (also referred to as "connectors") 18 extends from the testing and burn-in fixture 10 to connect the die 2 to external testing and burn-in circuitry. In this instance, the external connectors 18 are attached to the package body, extend therefrom, and are shown as connector pins 18, which are used in a dual in-line package or quad flat pack configuration. The external connectors 18 terminate in contact pads 20 in the package body 12 which are generally in line with the bond pads 22 of the die 2. The bond pads 22 of the die 2 are connected to the contact pads 20 of the package body 12 by lead wires 24 to allow testing of the die 2.

Referring to drawing FIG. 2, the testing and burn-in fixture 10 is shown in a partial cross-sectional view. As shown, the testing and burn-in fixture may include one or more holes 26 located in the bottom of the package body 12 to use in the removal of the die 2 therefrom. Also shown, a piece of adhesively coated tape 30 is located between the die 2 and the bottom of the package body 12 to retain the die 2 during the testing and burn-in of the die 2.

Any suitable type of high temperature, pressure sensitive, adhesively coated tape 30 may be used to retain the die 2 in the package body 12 during the testing and burn-in thereof. The adhesively coated tape 30 may be coated with adhesive on either a single side or on both sides, as desired. The tape 30 is cut to such size and shape as is necessary to fit within the package body 12 to retain the die 2 therein during testing and burn-in. It is not necessary that the adhesive tape 30 be cut to the size of the die 2 being held in the fixture 10 during testing and burn-in thereof. While any suitable high temperature, pressure sensitive adhesive tape 30 may be used, it is preferred that the tape 30 have an adhesive thereon with a maximum working temperature of approximately 180 degrees Centigrade. Also, the tape 30 may use differing types of suitable adhesives thereon, such as pressure sensitive silicone adhesive, acrylic adhesive, etc. It is also desirable for the adhesive on the tape 30 to leave a non-conductive ash when it oxidizes or burns to prevent any potential problems of electrical connections with any portion of any die 2 being tested or during burn-in. In situations where the die 2 does not need to be tested or subjected to burn-in temperatures of up to and including approximately 180 degrees Centigrade and where a lower testing and burn-in temperature is acceptable, an adhesive such as an acrylic adhesive which is suitable up to approximately 155 degrees Centigrade may be used. Also, for ease of processing, it is desirable that tape 30 be backed tape, such as through the use of paper or the like, so that the piece of the tape 30 to be used in the fixture 10 may be easily, readily cut by a suitable cutting die having the desired configuration without the cutting die cutting through the paper backing on the tape. In this manner, the piece of tape 30 used in the fixture 10 may be readily removed after cutting to size by a simple vacuum tool, such as a pick and place TEFLON® nose vacuum tool.

The preferred tape 30 for use in the present invention is TEMP-R-TAPE of Kapton, the Kapton family K 100, K102, K 103, K104, K 250, K 250X and K 350 as sold by CHR Industries, Inc. of New Haven, Conn. Such preferred type tape has an adhesive thickness which varies from 0.0015 inches to 0.0045 inches, a backing thickness of 0.0005 inches to 0.002 inches, and a maximum adhesive working temperature range from 150 degrees Centigrade to 180 degrees Centigrade.

Figure 3:
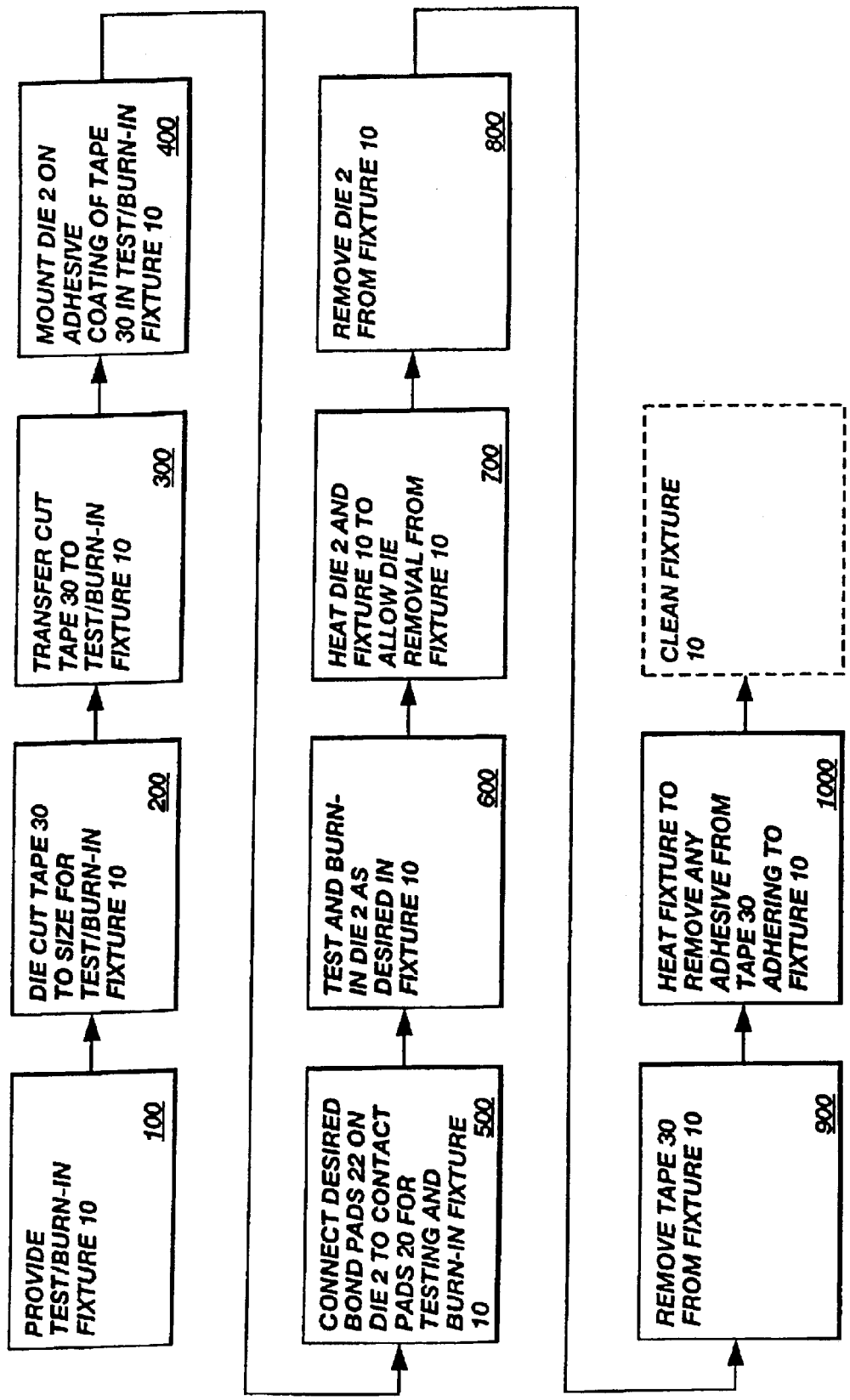
FIG. 3 is a flow diagram of the present invention.

Referring to drawing FIG. 3, the method of the present invention is shown. As previously stated and shown, a bare die 2 is attached to a test and burn-in fixture 10 by a high temperature, pressure sensitive adhesive tape 30. The electrical connections between the die 2 and the fixture 10 are made by solftool bonding, as shown in drawing FIGS. 1 and 2, or may be made by a bump contact method, if desired. The adhesive tape 30 holds the die 2 securely during all processing of the die 2 until such time as it is desired to remove the die 2 from the fixture 10. After the desired processing, the die 2 is removed from the carrier by subjecting the carrier to a thermal profile which degrades the adhesive on the tape 30 to a point where the die 2 can be picked out of the carrier with minimal force. At that time, any remaining adhesive on the fixture 10 may be removed by heating the fixture 10 until the remaining adhesive is ashed and can be removed from the fixture by any suitable desired method, such as by a blast of compressed air, or the like, by chemical solvent cleaning, or by mechanical cleaning.

As shown, in the step 100 of the method of the present invention, a test/burn-in fixture 10 suitable for use with the die 2 to be tested is provided. A cutting die is used to cut the desired piece of high temperature, pressure sensitive tape 30 to size to fit into the test/burn-in fixture 10 as step 200. The cut piece of tape 30 is transferred in step 300 to the test/burn-in fixture 10 by any suitable means, such as through the use of a TEFLON® nose, pick and place tool which uses a vacuum to pick up the cut piece of tape 30 and place it in the fixture 10. The die 2 is mounted on the adhesive coating of the tape 30 in the test/burn-in fixture 10 as step 400 of the present invention. At this time, the bond pads 22 on the die 2 are connected to the contact pads 20 of the fixture 10 by suitable means as step 500 of the present invention. At step 600 of the present invention, the die 2 is tested and burned-in as desired in the fixture 10 in which the die 2 is retained through the use of suitable adhesive tape 30. After testing and burn-in of the die 2, as step 700 of the present invention, the die 2 and fixture 10 are heated to a sufficient temperature to degrade the adhesive holding the die 2 on the tape 30 to allow the removal of the die 2 from the tape 30. As step 800 of the present invention, the die 2 is removed from the fixture 10 after sufficient heating thereof to degrade the adhesive on the tape 30. Subsequent to the removal of the die 2 from the fixture 10, as step 900 of the present invention, the tape 30 is removed from the fixture 10 and is disposed in a suitable manner. At this time, the fixture 10 is cleaned, as step 1000 of the present invention, to remove any remaining adhesive from the fixture 10 to allow the reuse thereof. The preferred method of cleaning any remaining adhesive from the fixture 10 is to heat the fixture 10 to a sufficient temperature to ash any remaining adhesive. Such a suitable temperature for the preferred tape and adhesives as described herein is in the range of 260 to 300 degrees Centigrade to degrade the adhesive to allow the removal of the die 2 from the fixture 10 and ash any remaining adhesive of the fixture 10. At this time, the fixture 10 may be easily cleaned by any suitable method of any ash adhesive thereon for reuse.

Figure 4:
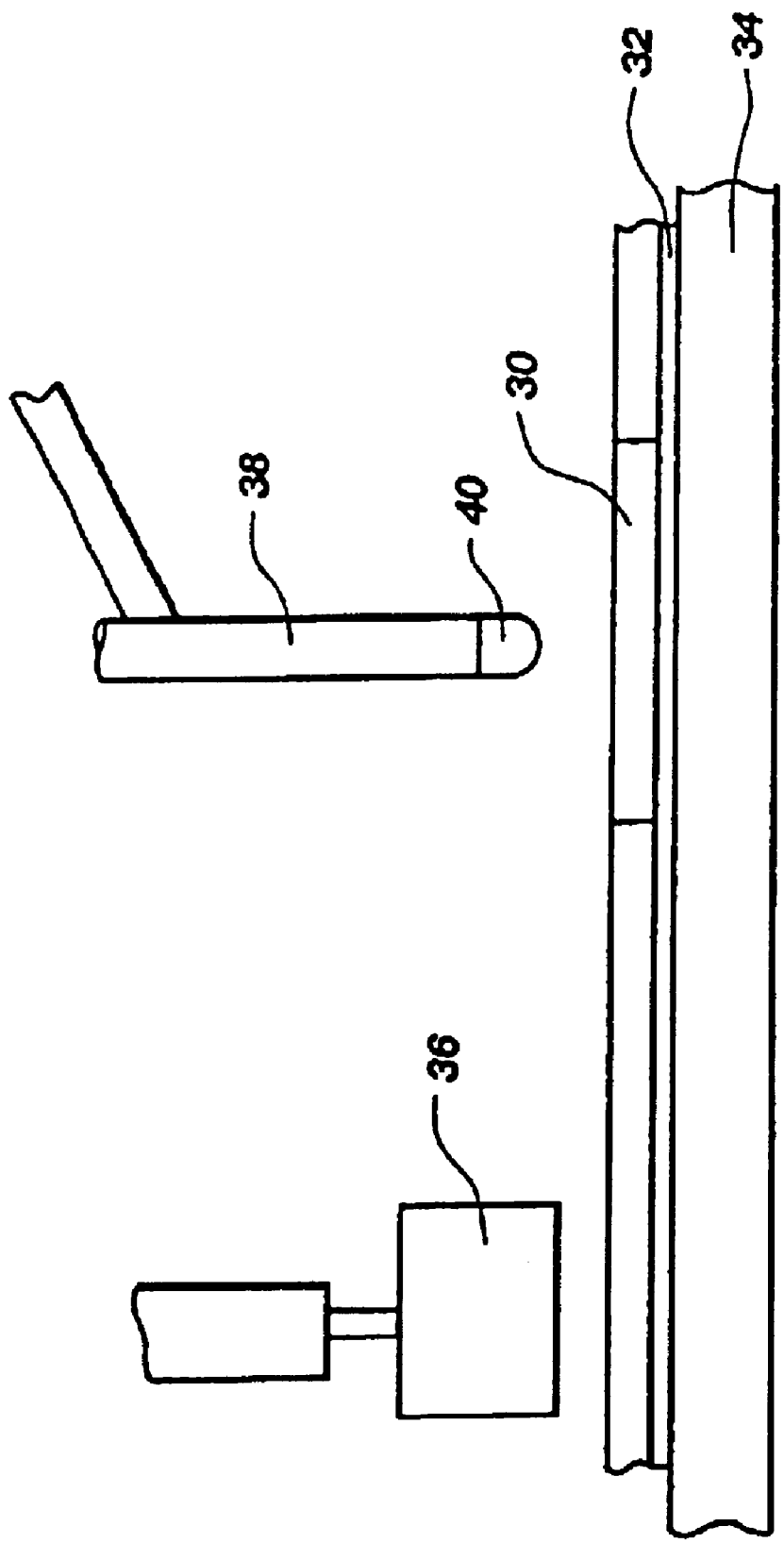
FIG. 4 is a sectional view of the die cutting the adhesively coated tape of the present invention and the vacuum transfer apparatus which may be used in the present invention.

Referring to drawing FIG. 4, tape 30 is shown having a suitable backing 32, such as paper, being supported on a cutting surface 34. A cutting die 36 of the desired configuration is used to cut the tape to be used in the fixture 10 to retain the die 2 therein during testing and burn-in. The cutting die 36 may be actuated by any suitable apparatus or may comprise a cutting wheel, if desired. After cutting the tape 30 to the desired configuration, a vacuum pick and place tool 38 having a TEFLON® nose 40 is used to transfer the piece of tape 30 to the fixture 10. The vacuum pick and place tool may be of any suitable design and actuation for use in placing the piece of tape 30 in the fixture 10.

From the foregoing it can be seen that many changes, additions, deletions, etc., may be made to the present invention which fall within the scope thereof. Such are that different types of tape having differing types of adhesives may be used. Different types of cleaning of the fixture 10 may be used to remove any adhesive remaining thereon. The tape 30 may be placed in the fixture 10 by various suitable means, other than using a vacuum, to transfer the tape 30. The fixture 10 may be of any suitable type to retain the die 2 during testing and burn-in. The die 2 may be connected to the fixture 10 by any suitable means such as wire bonding or tape automated bonding.

What is claimed is:

1. A fixture for burn-in operations for a semiconductor die comprising:

a fixture having a cavity having a bottom surface for temporarily retaining the semiconductor die therein during the burn-in operations, the fixture including at least one contact pad located on a surface of the fixture other than the bottom surface for connection to at least one bond pad on the semiconductor die, the bottom surface having a hole extending therethrough for use in removal of the semiconductor die from the fixture;

a piece of tape having an adhesive coating on each side thereof for temporarily retaining the semiconductor die in the cavity in the fixture, the piece of tape located in the cavity in the fixture, the piece of tape for temporarily securing a second side of the semiconductor die and temporarily secured to the bottom surface of the cavity of the fixture covering the hole extending through the bottom surface of the cavity of the fixture, the piece of tape being at least one of substantially the same size as the cavity in the fixture and substantially the same size and shape as the cavity in the fixture; and at least one lead connector for directly connecting at least one bond pad of the semiconductor die to the at least one contact pad of the fixture.

2. The fixture of claim 1, wherein the piece of tape is substantially the same size as the cavity in the fixture.

3. The fixture of claim 1, wherein the piece of tape is substantially the same size and shape as the cavity in the fixture.

4. The fixture of claim 1, wherein the adhesive coating on the piece of tape comprises a silicone polymer-type adhesive.

5. The fixture of claim 1, wherein the piece of tape has a maximum working temperature of at least 155° C.

6. The fixture of claim 1, wherein the adhesive coating on the piece of tape comprises an acrylic-type adhesive.

* * * * *